(12) United States Patent
Yee

(10) Patent No.: US 7,424,063 B2
(45) Date of Patent: Sep. 9, 2008

(54) SIGNAL DECODING METHODS AND APPARATUS

(75) Inventor: Mong Suan Yee, Bristol (GB)

(73) Assignee: Kabushiki Kaisha Toshiba, Tokyo (JP)

( * ) Notice: Subject to any disclaimer, the term of this patent is extended or adjusted under 35 U.S.C. 154(b) by 591 days.

(21) Appl. No.: 10/939,503

(22) Filed: Sep. 14, 2004

(65) Prior Publication Data

US 2005/0094742 A1 May 5, 2005

(30) Foreign Application Priority Data

Oct. 3, 2003 (GB) ................................. 0323208.9
Jul. 28, 2004 (GB) ................................. 0416823.3

(51) Int. Cl.
*H04L 1/02* (2006.01)
(52) U.S. Cl. ...................................... 375/267
(58) Field of Classification Search ................ 375/264, 375/267, 316, 340, 341, 346; 455/101, 103, 455/130, 132, 133
See application file for complete search history.

(56) References Cited

U.S. PATENT DOCUMENTS

| | | | |
|---|---|---|---|
| 2002/0126772 A1 | 9/2002 | Brunel | |
| 2003/0236076 A1* | 12/2003 | Brunel | 455/101 |
| 2005/0053172 A1* | 3/2005 | Heikkila | 375/333 |

FOREIGN PATENT DOCUMENTS

| | | |
|---|---|---|
| EP | 1 220 464 | 7/2002 |
| EP | 1 363 405 | 11/2003 |
| EP | 1 376 921 | 1/2004 |
| GB | 1 296 522 | 11/1972 |
| WO | WO 02/09293 A2 | 1/2002 |
| WO | WO 2004/032402 A1 | 5/2004 |

OTHER PUBLICATIONS

Emanuele Viterbo, et al., "A Universal Lattice Code Decoder for Fading Channels", IEEE Transactions on Information Theory, vol. 45, No. 5, XP-002178307, Jul. 1999, pp. 1639-1642.

Babak Hassibi, et al., "On the Expected Complexity of Sphere Decoding", Institute of Electrical and Electronics Engineers, vol. 1 of 2, conf. 35, XP-010582204, Nov. 4, 2001, pp. 1051-1055.

Mohamed Oussama Damen, et al., "On Maximum-Likelihood Detection and the Search for the Closest Lattice Point", IEEE Transactions on Information Theory, vol. 49, No. 10, XP-002313805, Oct. 1, 2003, pp. 2389-2402.

* cited by examiner

*Primary Examiner*—Sam K Ahn
(74) *Attorney, Agent, or Firm*—Oblon, Spivak, McClelland, Maier & Neustadt, P.C.

(57) ABSTRACT

A method of decoding a transmitted string of symbols received as a received signal. The method includes searching for a candidate string of symbols, by searching for candidate symbols within a region of a multi-dimensional lattice, and decoding the transmitted string of symbols by selecting a candidate string of symbols. The candidate string of symbols includes a string of candidate symbols. The searching for the candidate symbols includes selecting a candidate value for one of the transmitted symbols, and testing whether a part of the multi-dimensional lattice defined by the selected candidate value is within a bounding distance from the received signal. The searching for the candidate symbols is stopped after a limiting number of performances of the testing. The decoding includes providing a linear estimate of the transmitted string of symbols when the searching for the candidate string of symbols fails to locate the candidate string of symbols.

16 Claims, 7 Drawing Sheets

SIGNAL DECODING METHODS AND APPARATUS

FIELD OF THE INVENTION

This invention is generally concerned with methods, apparatus and processor control code for decoding signals, in particular by means of sphere decoding.

BACKGROUND OF THE INVENTION

Sphere decoding is a technique with a range of applications in the field of signal processing. Here particular reference will be made to applications of the technique to signals received over a MIMO (multiple-input multiple-output) channel, and to space-time decoding. However embodiments of the invention described herein may also be employed in related systems such as multi-user systems, and for other types of decoding, for example for a multi-user detector in a CDMA (code domain multiple access) system.

There is a continuing need for increased data rate transmission and, equivalently, for more efficient use of available bandwidth at existing data rates. Presently WLAN (wireless local area network) standards such as Hiperlan/2 (in Europe) and IEEE802.11a (in the USA) provide data rates of up to 54 Mbit/s. The use of multiple transmit and receive antennas has the potential to dramatically increase these data rates, but decoding signals received over a MIMO channel is difficult because a single receive antenna receives signals from all the transmit antennas. A similar problem arises in multi-user systems, although symbols transmitted over the different channels are then uncorrelated. There is therefore a need for improved decoding techniques for MIMO systems. These techniques have applications in wireless LANs, potentially in fourth generation mobile phone networks, and also in many other types of communication system.

FIG. 1a shows a typical MIMO data communications system 100. A data source 102 provides data (comprising information bits or symbols) to a channel encoder 104. The channel encoder typically comprises a convolutional coder such as a recursive systematic convolutional (RSC) encoder, or a stronger so-called turbo encoder (which includes an interleaver). More bits are output than are input, and typically the rate is one half or one third. The channel encoder 104 is followed by a channel interleaver 106 and, in the illustrated example, a space-time encoder 108. The space-time encoder 108 encodes an incoming symbol or symbols as a plurality of code symbols for simultaneous transmission from each of a plurality of transmit antennas 110.

Space-time encoding may be described in terms of an encoding machine, described by a coding matrix, which operates on the data to provide spatial and temporal transmit diversity; this may be followed by a modulator to provide coded symbols for transmission. Space-frequency encoding may additionally (or alternatively) be employed. Thus, broadly speaking, incoming symbols are distributed into a grid having space and time and/or frequency coordinates, for increased diversity. Where space-frequency coding is employed the separate frequency channels may be modulated onto OFDM (orthogonal frequency division multiplexed) carriers, a cyclic prefix generally being added to each transmitted symbol to mitigate the effects of channel dispersion.

The encoded transmitted signals propagate through MIMO channel 112 to receive antennas 114, which provide a plurality of inputs to a space-time (and/or frequency) decoder 116. The decoder has the task of removing the effect of the encoder 108 and the MIMO channel 112, and may be implemented by a sphere decoder. The output of the decoder 116 comprises a plurality of signal streams, one for each transmit antenna, each carrying so-called soft or likelihood data on the probability of a transmitted symbol having a particular value. This data is provided to a channel de-interleaver 118 which reverses the effect of channel interleaver 106, and then to a channel decoder 120, such as a Viterbi decoder, which decodes the convolutional code. Typically channel decoder 120 is a SISO (soft-in soft-out) decoder, that is receiving symbol (or bit) likelihood data and providing similar likelihood data as an output rather than, say, data on which a hard decision has been made. The output of channel decoder 120 is provided to a data sink 122, for further processing of the data in any desired manner.

In some communications systems so-called turbo decoding is employed in which a soft output from channel decoder 120 is provided to a channel interleaver 124, corresponding to channel interleaver 106, which in turn provides soft (likelihood) data to decoder 116 for iterative space-time (and/or frequency) and channel decoding. (It will be appreciated that in such an arrangement channel decoder 120 provides complete transmitted symbols to decoder 116, that is for example including error check bits.)

It will be appreciated that in the above described communication system both the channel coding and the space-time coding provide time diversity and thus this diversity is subject to the law of diminishing returns in terms of the additional signal to noise ratio gain which can be achieved. Thus when considering the benefits provided by any particular space-time/frequency decoder these are best considered in the context of a system which includes channel encoding.

One of the hardest tasks in the communications system 100 is the decoding of the space-time (or frequency) block code (STBC), performed by decoder 116, as this involves trying to separate the transmitted symbols that are interfering with one another at the receiver. The optimal STBC decoder is the a posteriori probability (APP) decoder, which performs an exhaustive search of all possible transmitted symbols. Such a decoder considers every transmitted symbol constellation point for all the transmit antennas and calculates all possible received signals, comparing these to the actually received signal and selecting that (those) with the closest Euclidian distance as the most likely solution(s). However the number of combinations to consider is immense even for a small number of antennas, a modulation scheme such as 16 QAM (quadrature amplitude modulation), and a channel with a relatively short time dispersion, and the complexity of the approach grows exponentially with the data rate. Sub-optimal approaches are therefore of technical and commercial interest.

Some common choices for space-time block decoding include linear estimators such as zero-forcing, and minimum mean-squared error (MMSE) estimators. The zero-forcing approach may be applied to directly calculate an estimate for a string of transmitted symbols or estimated symbols may be determined one at a time in a 'nulling and cancelling' method which subtracts out the effect of previously calculated symbols before the next is determined. In this way, for example, the symbols about which there is greatest confidence can be calculated first.

Sphere decoding or demodulation provides greatly improved performance which can approach that of an APP decoder, broadly speaking by representing the search space as a lattice (dependant upon the matrix channel response and/or space-time encoder) and then searching for a best estimate for a transmitted string of symbols only over possible string of symbols that generate lattice points which lie within a hypersphere of a given radius centred on the received signal. The maximum likelihood solution is the transmitted signal which, when modified by the channel, comes closest to the corresponding received signal. In fact the matrix channel response and/or space-time encoder tends to skew the input point space away from a rectangular grid and in a convenient representation the search region in the input point space becomes an ellipsoid rather than a sphere.

As the search space is reduced from the entire lattice to only a small portion of the lattice the number of computations required for the search is very much less than that required by an APP decoder, but similar results can be achieved. There are, however, some difficulties in practical application of such a procedure. Firstly one must identify which lattice points are within the required distance of the received signal. This is a relatively straightforward procedure, and is outlined below. Secondly, however, one must decide what radius to employ. This is crucial to the speed of the search and should be selected so that some, but not too many, lattice points are likely to be found within the radius. The radius may be adjusted according to the noise level and, optionally, according to the channel. However there is a further, more subtle problem which is that even with a known search radius the search problem is unbounded which, in a practical system, means that the time necessary for a sphere decoding calculation (and hence the available data rate) cannot be determined. This is one problem which is addressed by embodiments of the invention.

Background prior art relating to sphere decoding can be found in:

E. Agrell, T. Eriksson, A. Vardy and K. Zeger, "Closest Point Search in Lattices", IEEE Transa. on Information Theory, vol. 48, no. 8, August 2002; E. Viterbo and J. Boutros, "A universal lattice code decoder for fading channels", IEEE Trans. Inform. Theory, vol. 45, no. 5, pp. 1639-1642, July 1999; O. Damen, A. Chkeif and J. C. Belfiore, "Lattice code decoder for space-time codes," IEEE Comms. Letter, vol. 4. no. 5, pp. 161-163, May 2000; B. M. Hochwald and S. T. Brink, "Achieving near capacity on a multiple-antenna channel," http://mars.bell-labs.com/cm/ms/what/papers/list-sphere/, December 2002; "On the expected complexity of sphere decoding", in Conference Record of the Thirty-Fifth Asimolar Conference on Signals, Systems and Computers, 2001, vol. 2 pp. 1051-1055; B. Hassibi and H. Vikalo, "Maximum-Likelihood Decoding and Integer Least-Squares: The Expected Complexity", in Multiantenna Channels: Capacity, Coding and Signal Processing, (Editors J. Foschini and S. Verdu), http://www.its.caltech.edu/~hvikalo/dimacs.ps; A. M. Chan, "A New Reduced-Complexity Sphere Decoder For Multiple Antenna System", IEEE International Conference on Communications, 2002, vol. 1, April-May 2002; L. Brunel, J. J. Boutros, "Lattice decoding for joint detection in direct-sequence CDMA systems",IEEE Transactions on Information Theory, Volume: 49 Issue: 4, April 2003, pp. 1030-1037; A. Wiesel, X. Mestre, A. Pages and J. R. Fonollosa, "Efficient Implementation of Sphere Demodulation", Proceedings of IV IEEE Signal Processing Advances in Wireless Communications, pp. 535, Rome, Jun. 15-18, 2003; U.S. Patent Application Number US20030076890 B. M. Hochwald and S. Ten Brink, filed Jul. 26, 2002, "Method and apparatus for detection and decoding of signals received from a linear propagation channel", to Lucent Technologies, Inc; U.S. Patent Application Patent Number US20020114410 L. Brunel, filed Aug. 22, 2002, "Multiuser detection method and device in DS-CDMA mode", to Mitsubishi; H. Vikalo, "Sphere Decoding Algorithms for Digital Communications", PhD Thesis, Standford University, 2003; B. Hassibi and H. Vikalo, "Maximum-Likelihood Decoding and Integer Least-Squares: The Expected Complexity," in *Multiantenna Channels: Capacity, Coding and Signal Processing*, (editors J. Foschini and S. Verdu).

The Agrell et al reference describes closest-point search methods for an infinite lattice where the input is an arbitrary m-dimensional integer, that is $x \in Z^m$, reviewing the basic concept of lattice decoding and search methods, but only describing methods which provide a hard decision output. Most of the other references require the evaluation of a search region bound and nevertheless do not guarantee a bounded computational complexity calculation.

Wiesel et al describe one technique for determining a search radius by setting the search radius to the largest distance metric, $$\sqrt{\sum_{n=1}^{n_T} d_n^2},$$

among the K symbols found by the search algorithm. Here, K is a predetermined number of symbols, say 50, required to evaluate a soft output. The initial search radius is set to infinity until K symbols is found. When the list is full, i.e. K symbols found, the search radius is set to the largest distance metric in the list. A heap sort is proposed as an efficient method to sort the candidate list, such that the list of candidates has K shortest distance metrics possible. This effectively acts as a set-up procedure. However again, depending upon the channel statistics the computational complexity of this method is not bounded.

Other decoders or detectors (here the terms are employed substantially synonymously since both imply an attempt to solve a similar problem, that is detecting the originally transmitted data) include trellis-based decoders such as the Viterbi decoder (which have exponential computational complexity), and reduced complexity detectors which provides sub-optimum performance, such as the vertical BLAST (Bell labs LAyered Space Time) decoder and the block decision feedback equalizer.

It is helpful, at this point, to provide an outline review of the operation of the sphere decoding procedure. For a string of N transmitted symbols an N-dimensional lattice is searched, beginning with the Nth dimensional layer (corresponding to the first symbol of the string). A symbol is selected for this layer from the constellation employed and the distance of the generated lattice point from the received signal is checked. If the lattice point is within this distance the procedure then chooses a value for the next symbol in the string and checks the distance of the generated lattice point from the received signal in N-1 dimensions. The procedure continues checking each successive symbol in turn, and if all are within the bound it eventually converges on a lattice point in one dimension. If a symbol is outside the chosen radius then the procedure moves back up a layer (dimension) and chooses the next possible symbol in that layer (dimension) for checking. In this way the procedure builds a tree in which the lowest nodes correspond to complete strings of symbols and in which the number of nodes at the nth level of the tree corresponds to the number of lattice points inside the relevant nth dimensional sphere.

When a complete candidate string of symbols is found the distance of the lattice point, generated from the string of symbols, from the received signal is found and the initial radius is reduced to this distance so that as the tree builds only closer strings to the maximum-likelihood solution are identified. When the tree has been completed the decoder can be used to provide a hard output, i.e. the maximum likelihood solution, by choosing the nearest lattice point to the received signal. Alternatively a soft output can be provided using a selection of the closest lattice points to the received signal, for example using the distance of each of these from the received signal as an associated likelihood value. A heap sort has been proposed for selecting a subset of candidates having lattice point with the shortest distance metrics to the received signal as described further below. Another proposed method sets a fixed search radius throughout the search and a subset of candidates providing distance metrics less than the fixed search radius is selected.

SUMMARY OF THE INVENTION

According to a first aspect of the present invention there is provided a method of decoding a transmitted signal encoded as a string of symbols and received over a channel as a received signal, each transmitted symbol having one of a plurality of values, the method comprising: searching for one or more candidate strings of symbols, a candidate string of symbols comprising a string of candidate symbols, by searching for candidate symbols of said string within a region of a multi-dimensional lattice determined by said channel response, said lattice having one dimension associated with each of said symbols of said string, said region being defined by distance from said received signal; and decoding a said string of symbols for said received signal by selecting one or more of said candidate strings of symbols; wherein said searching for candidate symbols comprises selecting candidate values for said transmitted symbols and testing whether a part of said lattice defined by a selected said candidate is within a bounding distance from said received signal; and wherein said searching is stopped after a limiting number of candidate symbol tests.

In embodiments stopping the candidate symbol searching after a limiting number of candidate symbol tests (and/or candidate distance determinations) bounds the computational complexity and enables processing to decode the transmitted signal to be performed at a fixed data rate without the risk of, say, an absence of a decoding solution. The testing determines whether a selected candidate, or more strictly, whether a lattice point or layer generated by a selected candidate, is within a bounding distance from the received signal. In embodiments a candidate symbol test comprises a test to determine whether a symbol is inside or outside a bounding distance or whether the symbol comprises the last symbol of an estimated transmitted string. Thus the number of cases of each of these three categories may be counted and the searching stopped after a predetermined limiting count is reached.

In embodiments the (initial) bounding distance or radius still has an effect on the decoding process as this influences, for example, the tree constructed by the pre-determined number of candidate symbol tests. For this reason the bounding distance or radius may be adapted, for example in dependence on the noise or noise variance and/or channel response.

The procedure attempts to test a candidate value for each symbol of the string but, depending upon the channel and received signal a complete tree with at least one complete set of candidate symbols for a string at an end node of the tree may not be constructed. When the searching fails to locate a candidate string of symbols a linear, preferably zero-forcing, estimate may be provided as an output of the decoding procedure. Any linear estimate, such as a linear estimate with successive interference cancellation and an MMSE solution may be employed. Generally each symbol is defined by one or more bits so that the string of symbols defines a string of bits. The decoding may then comprise (or further comprise) providing a probability value for each bit of the string of bits. The symbols of the zero-forcing solution can be employed to calculate such soft bit values when a candidate string of symbols is not located.

The decoding may provide a hard output by selecting the minimum distance candidate string of symbols for output, or a so-called soft output may be provided comprising, in effect, a plurality of decoded strings of symbols each with an associated probability, for example dependent upon a distance of a lattice point generated from the string of symbols from the received signal. The searching searches for candidate symbols of the string, which form lattice points within a region of the multi-dimensional lattice determined by said channel response. The soft output may, in effect, comprise (probabilities for) all of the candidate strings of symbols found by the searching, to avoid the need for a sort. Each symbol is generally associated with one or more transmitted bits and the decoding may further comprise providing a probability value for each of these bits, for example determined based upon all of the candidate strings of symbols found by the searching, where at least one candidate string of symbols is found (as described further with reference to equation 27 below). A probability value for a bit may be determined by taking a ratio of likelihood values for the bit having first and second logic levels, based upon sets of symbols (of the identified candidate strings) in which the bit has respective first and second logic values. Where, for a bit, no symbols of a candidate string have one (or other) or these values and such a ratio cannot be calculated a default probability value for the bit may be provided, for example based upon a minimum distance metric for the other logic value, or comprising a default maximum value such as 50.

In preferred embodiments the searching for candidate symbols proceeds in order of increasing distance from a zero-forcing estimate of said transmitted signal (or another linear or simple to compute estimate), for example determined from said received signal and a response of said channel. This approach may be applied to the layers searched (so that, for example, the search can begin with a symbol of the string in which there is a high degree of confidence) and/or to the selection of successive symbols of a constellation at a layer (dimension) or tree node.

The string of symbols may comprise symbols transmitted from a plurality of users in a multi-user communications system or a string of symbols transmitted by a plurality of transmit antennas, and received by a second plurality of receive antennas, in a MIMO communications system (in both cases the channel comprising a form of matrix channel). In a MIMO communications system the string of symbols may comprise symbols of a space-time block code (STBC) or symbols of a space-time trellis code (STTC), or symbols of a space-frequency code, or symbols of a space-time/frequency code. A space-frequency coded signal is encoded across a plurality of frequency channels, for example in a multi-carrier OFDM (orthogonal frequency division multiplexed) system in which case the decoder may be preceded by a serial-to-parallel converter and fast Fourier transformer, and followed by an inverse Fourier transformer and a parallel-to-serial conversion.

It will be appreciated that the above described methods may be employed, for example, in a turbo-decoder with iterative block code decoding and channel decoding.

The invention further provides decoders configured to implement the above described methods, and receivers including such decoders.

Thus in a further aspect the invention provides a decoder for decoding a transmitted signal encoded as a string of symbols and received over a channel as a received signal, each transmitted symbol having one of a plurality of values, the decoder comprising: means for searching for one or more candidate strings of symbols, a candidate string of symbols comprising a string of candidate symbols, by searching for candidate symbols of said string within a region of a multi-dimensional lattice determined by said channel response, said lattice having one dimension associated with each of said symbols of said string, said region being defined by distance from said received signal; and means for decoding a said string of symbols for said received signal by selecting one or more of said candidate strings of symbols; wherein said means for searching for candidate symbols is configured to select candidate values for said transmitted symbols and to test whether a part of said lattice defined by a selected said candidate is within a bounding distance from said received signal; and wherein said searching is stopped after a limiting number of candidate symbol tests.

In the above aspects of the invention the multidimensional lattice may be additionally or alternatively be determined by a space-time or other encoding employed at the transmitter.

In another related aspect the invention provides a decoder for decoding a received signal comprising a string of symbols transmitted over a MIMO channel, the decoder comprising: a sphere decoder to search for candidate transmitted symbol strings within a radius of said received signal by determining distances from said received signal in received signal space of candidate symbols for said string, and to provide a decoded data output; and a sphere decoder controller to count said distance determinations and to control said sphere decoder to stop searching responsive to said count.

Preferably the decoder further includes a symbol estimator to determine an initial estimate of said transmitted symbols, and the sphere decoder may then search for candidate transmitted symbol strings which generate lattice points within a radius of said received signal by determining said distance metrics, starting from said initial estimate.

The skilled person will recognise that the above-described methods and decoders may be implemented using and/or embodied in processor control code. Thus in a further aspect the invention provides such code, for example on a carrier medium such as a disk, CD- or DVD-ROM, programmed memory such as read-only memory (Firmware) or on a data carrier such as an optical or electrical signal carrier. Embodiments of the invention may be implemented on a DSP (Digital Signal Processor), ASIC (Application Specific Integrated Circuit) or FPGA (Field Programmable Gate Array). Thus the code may comprise conventional program code, or microcode, or, for example, code for setting up or controlling an ASIC or FPGA. In some embodiments the code may comprise code for a hardware description language such as Verilog (Trade Mark) or VHDL (Very high speed integrated circuit Hardware Description Language). As the skilled person will appreciate, processor control code for embodiments of the invention may be distributed between a plurality of coupled components in communication with one another.

These and other aspects of the invention will now be further described, by way of example only, with reference to the accompanying figures in which:

DETAILED DESCRIPTION

Figure 1A:
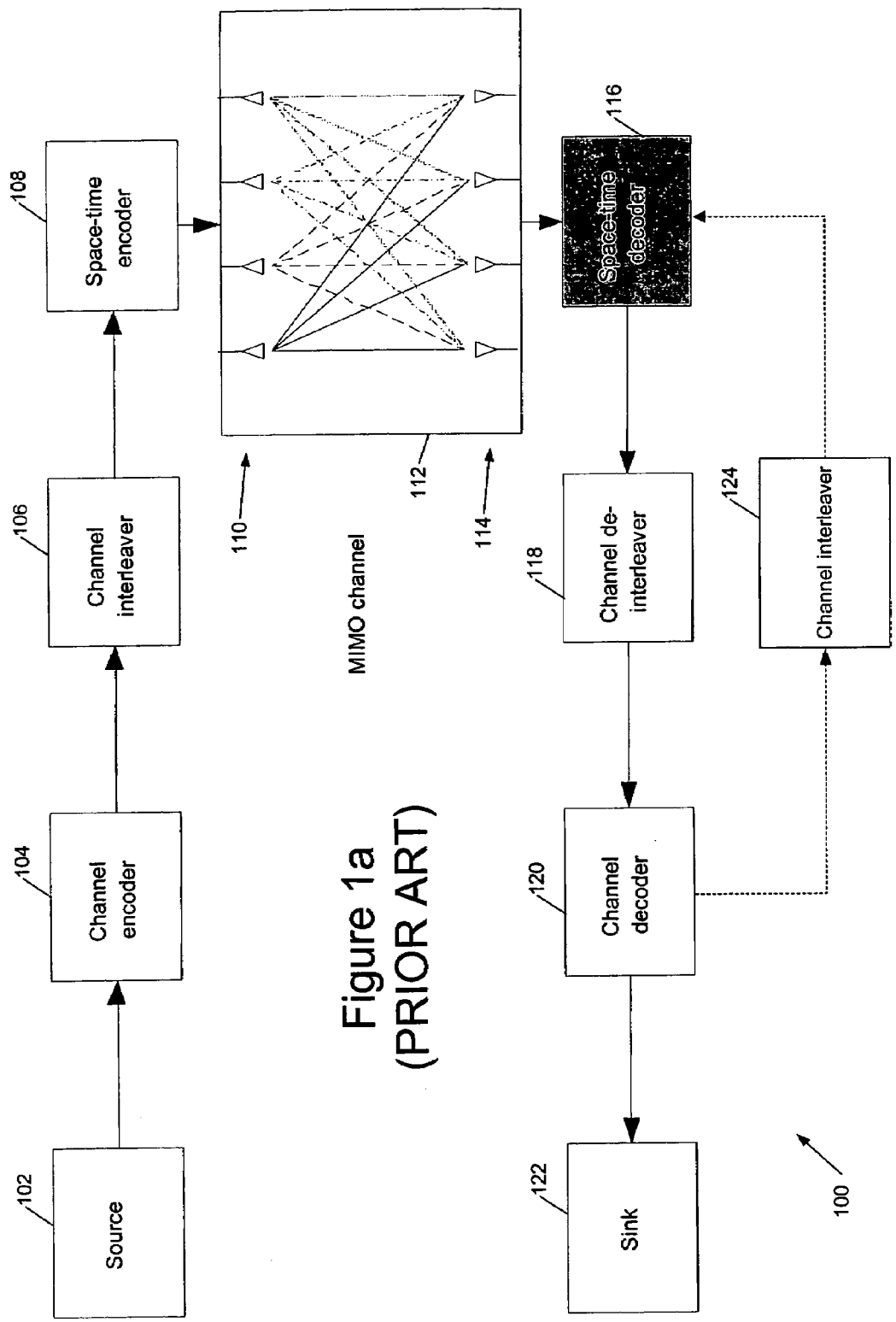
FIGS. 1a and 1b show, respectively, an example of a MIMO space-time coded communications system employing a sphere decoder, and a pictorial illustration of a sphere decoder tree search.

Embodiments of the invention address the variable computational complexity issues of the sphere decoding concept and, in particular, bound the computational complexity by limiting the number of searches to be done to find possible candidates for the transmitted symbols. Furthermore embodiments of the invention provide methods to evaluate a soft output if insufficient candidates are found to approximate a maximum a posteriori likelihood of the transmitted bits. Embodiments of the invention are discussed with reference to (but are not limited to) space-time decoding or detecting.

Consider a space-time transmission scheme with $n_T$ transmitted and $n_R$ received signals (or, equivalently, a transmitted and a received signal with $n_T$ and $n_R$ components respectively). The $1 \times n_R$ received signal vector at each instant time k is given by:

$$\tilde{r}_k = \tilde{s}_k \tilde{H}_k + \tilde{v}_k \qquad \text{Equation 1}$$

where $$\tilde{s}_k = [\tilde{s}_k^1 \ \ldots \ \tilde{s}_k^{n_T}]$$

denotes the transmitted signal vector whose entries are chosen from a complex constellation C with $M=2^q$ possible signal points, where q is the number of bits per constellation symbol. The AWGN (Additive White Gaussian Noise) vector $\tilde{v}_k$ is a $1 \times n_R$ vector of independent, zero-mean complex Gaussian noise entries with variance of $\sigma^2$ per real component. The notation $\tilde{H}_k$ denotes an $n_T \times n_R$ multiple-input/multiple-output (MIMO) channel matrix assumed to be known or estimated at the receiver, with n-row and m-column component $h_{n,m}$, $n=1, \ldots, n_T$, $m=1, \ldots, n_R$, representing the narrowband flat fading between the n-th transmitted signal and m-th received signal. The channel fade may be assumed to be constant over a symbol period.

In a receiver a MIMO channel estimate $H_k$ can be obtained in a conventional manner using a training sequence. For example a training sequence can be transmitted from each transmit antenna in turn (to avoid interference problems), each time listening on all the receive antennas to characterise the channels from that transmit antenna to the receive antennas. This need not constitute a significant overhead and data rates are high in between training and, for example, with slowly changing indoor channels training may only be performed every, say, 0.1 seconds. Alternatively orthogonal sequences may be transmitted simultaneously from all the transmit antennas, although this increases the complexity of the training as interference problems can than arise.

All linear space-time block coded transmission schemes can be written in the form of Equation 1. For example, BLAST (G. J. Foschini, "Layered space-time architecture for wireless communication in a fading environment when using multi-element antennas," Bell Labs. Tech. J., vol. 1, no. 2, pp. 41-59, 1996) uses the transmit antennas to send a layered structure of signals, and therefore $n_T$ represents the number of transmit antennas, $n_R$ represents the number of receive antennas and $H_k$ is the true MIMO channel matrix. Other examples include orthogonal designs (S. M. Alamouti, "A simple transmitter diversity scheme for wireless communications," IEEE J. Sel. Area Comm., pp. 1451-1458, October 1998; and V. Tarokh, H. Jafarkhani and A. R. Calderbank, "Space-time block codes from orthogonal designs," IEEE Trans. Info. Theory., vol. 45, pp. 1456-1467, July 1999) and linear dispersive codes (B. Hassibi and B. Hochwald, "High-rate codes that are linear in space and time," IEEE Trans. Info. Theory., vol. 48, pp. 1804-1824, July 2002), where $H_k$ is an effective channel derived from one or more uses of the true channel.

Ignoring the time index k for simplicity of discussion, the n-th component of the transmitted symbol $\tilde{s}$ is obtained using the symbol mapping function $$\tilde{s}^n = \text{map}(x^n), \ n=1, \ldots, n_T \quad \text{Equation 2}$$

where $$x^n = [x_1^n \ldots x_q^n] \quad \text{Equation 3}$$

is a vector with q transmitted data bits, and q is the number of bits per constellation symbol. (More generally, however, $\tilde{s}$ denotes a string of symbols encoded over space and/or time and/or frequency and n runs over the length of the string). Therefore the $(q \cdot n_T)$-length vector of bits transmitted can be denoted by $$x = [x^1 \ldots x^{n_T}] \quad \text{Equation 4}$$

and the transmitted vector constellation may be written as $$\tilde{s} = \text{map}(x) \quad \text{Equation 5}$$

The maximum a posteriori probability (APP) bit detection, conditioned on the received signal $\tilde{r}$ for the space-time transmission of Equation 1 can be expressed in likelihood ratios (LLR) as follows:

$$L_P(x_j^n | \tilde{r}) = \ln \frac{P(x_j^n = +1 | \tilde{r})}{P(x_j^n = -1 | \tilde{r})} \quad \text{Equation 6}$$

$$= L_A(x_j^n) +$$

-continued $$\ln \frac{\sum_{x \in X_{n,j}^{+1}} \exp\left(-\frac{1}{2\sigma^2} \cdot \|\tilde{r} - \hat{s}\tilde{H}\|^2 + \frac{1}{2} \cdot x_{[n,j]}^T \cdot L_{A,[n,j]}\right)}{\sum_{x \in X_{n,j}^{-1}} \exp\left(-\frac{1}{2\sigma^2} \cdot \|\tilde{r} - \hat{s}\tilde{H}\|^2 + \frac{1}{2} \cdot x_{[n,j]}^T \cdot L_{A,[n,j]}\right)}$$

$$\underbrace{\phantom{XXXXXXXXXXXXXXXXXXXXXXXXXXX}}_{L_E(x_j^n | \tilde{r})}$$

$$n = 1, \ldots, n_T \quad j = 1, \ldots, q$$

and the $L_E(\cdot)$ term can be approximated by $$L_E(x_j^n | \tilde{r}) \approx \frac{1}{2} \max_{x \in X_{n,j}^{+1}} \left\{ -\frac{1}{\sigma^2} \cdot \|\tilde{r} - \hat{s}\tilde{H}\|^2 + x_{[n,j]}^T \cdot L_{A,[n,j]} \right\} \quad \text{Equation 7}$$
$$- \frac{1}{2} \max_{x \in X_{n,j}^{-1}} \left\{ -\frac{1}{\sigma^2} \cdot \|\tilde{r} - \hat{s}\tilde{H}\|^2 + x_{[n,j]}^T \cdot L_{A,[n,j]} \right\}$$

$$\underbrace{\phantom{XXXXXXXXXXXXXXXXXXXXXXXXX}}_{\text{max-log approximation}}$$

where x is the sequence of possible transmitted bits, $x_{[n,j]}$ denotes the sub vector of x obtained by omitting its element $x_j^n$, and $L_{A,[n,j]}$ denotes the vector of all $L_A$-values, also omitting the element corresponding to bit $x_j^n$; and where, for each term in the summations of Equation 6, $\hat{s}$ is given by Equation 5 with x as the vector under the summation sign, and where $\|\cdot\|$ denotes the Euclidean norm. The sets $$X_{n,j}^{+1}$$

and $$X_{n,j}^{-1}$$

are the sets of $2^{(q \cdot n_T - 1)}$ vectors of bits x having $x_j^n = +1$, and $x_j^n = -1$, respectively, that is $$X_{n,j}^{+1} = \{x \mid x_j^n = +1\}$$

and $$X_{n,j}^{-1} = \{x \mid x_j^n = -1\}.$$

In other words the sum in, say, the numerator of Equation 6 runs over all symbols that have bit $x_j^n = +1$.

The symbol $\hat{s}$ is the mapping to the possible transmitted bit vector x. The functions $L_P(\cdot)$, $L_A(\cdot)$ and $L_E(\cdot)$ denote the a posteriori, a priori and extrinsic likelihood respectively. The a priori likelihood $L_A(\cdot)$ may be derived, for example, from an a priori input from a channel coder (for, say, iterative turbo decoding) or may be set or initialised, say to zero (a log likelihood ratio $L(\cdot)$ of 0 implying that +1 and −1 are equiprobable). Equation 6 is the optimum maximum a posteriori probability (MAP) solution and Equation 7 provides the maximum logarithmic approximation of the MAP solution (sometimes called the max-log-MAP solution). Embodiments of the invention are able to provide an approximation of the solutions of both Equation 6 and Equation 7.

According to Equation 6 APP detection requires an exhaustive evaluation of $2^{q \cdot n_T}$ distance metrics $\|\tilde{r}-\hat{s}\tilde{H}\|^2$ corresponding to number of elements in the sets $X^{+1}$ and $X^{-1}$. The computational complexity of APP detection increases exponentially with the number of bits per symbol q and the number of spatial-multiplexed transmitted symbol $n_T$. One way to approximate Equation 6 is to include only the candidates in the set $X^{+1}$ and $X^{-1}$ for which $$\|\tilde{r}-\hat{s}\tilde{H}\|^2 \leq \rho^2 \quad \text{Equation 8a}$$

$$\|r-\hat{s}H\|^2 - \sigma^2 x^T \cdot L_A \leq \rho^2 \quad \text{Equation 8b}$$

where Equation 8a is without a priori knowledge and Equation 8b is with a priori knowledge, where ρ is is the bound radius of the sphere decoder.

This approximation assumes that the candidates providing the distance metrics outside the bound defined by Equations 8a and 8b do not provide a significant contribution to the APP detection (see Equation 6). The sphere decoding algorithm provides a procedure to rapidly find a list of candidates satisfying either Equation 8a or 8b.

The original sphere decoder, also known as the lattice decoder, (Viterbo and Boutros, ibid) provides the maximum likelihood estimation, that is a hard output of transmitted symbols for a real constellation and channels, representing the communication system as a lattice. Here we describe a particular implementation of a soft-in/soft-out sphere decoder, suitable for a multiple antenna system, based on this original idea.

To obtain a lattice representation of the multiple antenna system, the complex matrix representation of Equation 1 (ignoring the time index k) can be transformed to a real matrix representation with twice the dimension of the original system as follows:

$$r = sH + v \quad \text{Equation 9}$$

where $$r = [\,\Re\{\tilde{r}\} \quad \Im\{\tilde{r}\}\,] \quad \text{Equation 10}$$

$$s = [\,\Re\{\tilde{s}\} \quad \Im\{\tilde{s}\}\,] \quad \text{Equation 11}$$

$$H = \begin{bmatrix} \Re\{\tilde{H}\} & \Im\{\tilde{H}\} \\ -\Im\{\tilde{H}\} & \Re\{\tilde{H}\} \end{bmatrix} \quad \text{Equation 12}$$

$$v = [\,\Re\{\tilde{v}\} \quad \Im\{\tilde{v}\}\,] \quad \text{Equation 13}$$

We shall use the real-valued representation of Equation 9 to Equation 13 in the following description of the sphere decoder. Using the nomenclature used in lattice theory, the real-valued representation of the channel H is the generator matrix of the lattice, the channel input (transmit signal) s is the input point of the lattice and the noiseless channel output term sH defines a lattice point.

An n-dimensional lattice can be decomposed into (n−1) dimensional layers. The search algorithm for a n dimensional lattice can be described recursively as a finite number of (n−1)-dimensional search algorithms. Viterbo and Boutros (ibid) described the search algorithm in terms of three different states, or cases, of the search:

TABLE 1

| | |
|---|---|
| Case A | The n-th dimensional layer is within the search bound: The layer is decomposed into (n − 1)-th dimensional layers. |
| Case B | The search succesfully reaches the zero-dimensional layer and a lattice point in the search region is found |
| Case C | The n-th dimensional layer is not within the search bound: The search moves up one step in the hierarchy of layers. |

The search procedure is simplified if the lower triangular matrix $U^T$, derived from QR decomposition or Cholesky factorisation (sometimes referred to as taking the square root of a matrix) of the channel matrix, is used as a generator matrix for the lattice. For example, if QR decomposition is used (see, for example, G. H. Golub and C. F. van Loan, Matrix Computations, John Hopkins University Press, 1983), the lower triangular matrix $U^T$ (and upper U) are defined as follows:

$$U^T U = H^T H \quad \text{Equation 14}$$

Figure 1B:
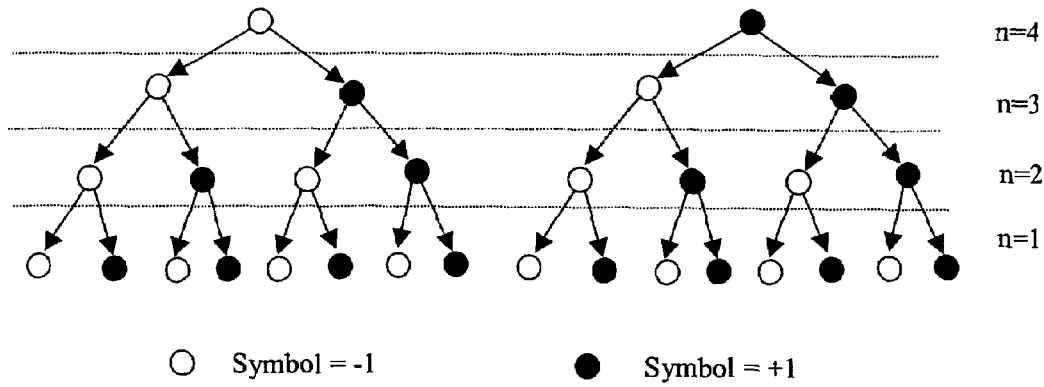

Here, the lattice search involves a generalized nulling and cancelling, where after a component of the vector ŝ that satisfies Equation 8 is found, its contribution to the distance metrics is subtracted. However (unlike in normal nulling and cancelling heuristics) components of ŝ are not fixed until an entire vector which satisfies Equation 8 is found. Therefore, the algorithm essentially performs a search on a tree as shown in FIG. 1b, where the nodes on the n-th level of the tree correspond to the sub-vector $[\hat{s}^n \ldots \hat{s}^{n_T}]$.

Describing further the distance metrics used by the search algorithm, we now assume the generator matrix is a lower-triangular matrix. During the nth dimensional lattice search or the search of the nth transmitted signal, the orthogonal distance of the received signal r to the layer with index $\hat{s}^n \in C_{real}$, where $C_{real}$ is the real-valued symbol constellation representation, is defined as:

$$d_n = \left| \frac{\hat{r}^n}{h_{n,n}} - \hat{s}^n \right| \cdot |h_{n,n}| \quad \text{Equation 15}$$

$$= |e^{n,n} - \hat{s}^n| \cdot |h_{n,n}|$$

where $\hat{r}^n$ is the nth component of the projected received signal in the n-dimensional space, having found the higher level transmitted symbols, $\hat{s}^{n+1}, \ldots, \hat{s}^{n_T}$ (in this example we assume $n_T = n_R$). The term $e^{n,n}$ is the estimate of the nth transmitted symbol according to the projected received signal. The estimate of rest of the transmitted symbols $\hat{s}^i$, i=1, ..., n can be obtained recursively as follows (see Agrell et al., ibid.):

$$e^{n,i} = e^{n+1,i} - \frac{d_{n+1}}{h_{i,n+1}} \quad \text{where } i = 1, \ldots, n. \quad \text{Equation 16}$$

Therefore, the distance metrics $d_n$ can be updated according to the current transmitted symbol searched, $\hat{s}^n$ and the previously found higher level transmitted symbols, $\hat{s}^{n+1}, \ldots, \hat{s}^{n_T}$. Since the distance metrics during the n+1 th dimensional lattice search varies with the n+1 th transmitted symbol found, the bound used at the n-th dimensional search may be updated as follows:

$$\rho_n^2 = \rho_{n+1}^2 - d_n^2 \quad \text{Equation 17}$$

Having described the distance metrics used in the search algorithm, the ordering of the constellation symbols to be searched will now be explained. The distance metrics (now using the real-valued representation) can be written as follows:

$$\|r - \hat{s}H\|^2 = (\hat{s} - s'')^T H^T H (\hat{s} - s'') + r^T(I - H(H^TH)^{-1}H^T)r \quad \text{Equation 18}$$

where $$s'' = (H^TH)^{-1}H^Tr \quad \text{Equation 19}$$

is the unconstrained maximum likelihood estimate of the transmitted symbol s and also known as the zero-forcing solution. Therefore, one can redefine the bound given in Equation 8a as follows:

$$(\hat{s} - s'')^T H^T H (\hat{s} - s'') \leq \rho^2 \quad \text{Equation 20}$$

It is observed that the range of $\hat{s}$ satisfying Equation 20 centres around the zero forcing solution s''. Therefore, the symbols to be searched at n-th level, $\hat{s}^n \in C_{real}$, are preferably ordered according to an increasing distance from the zero-forcing solution s''$^n$ at each n-th level. For example, if the symbol constellation is 4PAM (Pulse Amplitude Modulation), i.e., $C_{real} = \{-3, -1, +1, +3\}$, and the zero-forcing solution at n-th level search is s'''$^n = -1.1$, the symbols to be searched are ordered as $\{-1, -3, +1, +3\}$. This avoids an explicit calculation of the search upper and lower bound. The possible transmitted symbols are searched according to the above-mentioned ordering and the search at n-th level is stopped when the distance metrics exceed the bound, i.e., $$d_n^2 > \rho_n^2 \quad \text{Equation 21}$$

for the current symbol $\hat{s}^n$ searched. The search then proceeds to the next search hierarchy or level. The ordering can be done via a look up table storing all the possible combinations. For example, given a c×M matrix $\Phi$ where c=2M is the number of symbol search combination and M is the number of possible signal points, the sorted vector slist for the zero-forcing solution s'''$^n$, is given as the i-th row of $\Phi$ as follows:

$$\text{slist} = \Phi(i) \text{ where } i = \lceil s''' \rceil + M - 1 \quad \text{Equation 22}$$

and $\lceil\ \rceil$denotes the rounding towards infinity. Broadly speaking this technique comprises a modified version of the Schnorr-Euchner strategy described in Agrell et al. (ibid).

Methods for ordering the symbols to be searched using look-up table are described in more detail in A. Wiesel, X. Mestre, A. Pages and J. R. Fonollosa, "Efficient Implementation of Sphere Demodulation", Proceedings of IV IEEE Signal Processing Advances in Wireless Communications, pp. 535, Rome, Jun. 15-18, 2003, which is hereby incorporated by reference.

The zero forcing solution s'''$^n$ (or other linear estimate) is re-estimated at every search hierarchy since the symbol found in the previous search $\hat{s}^{n+1}$ is cancelled out to obtain a reduced-order integer least-square problem with n unknowns (see Equations 15 and 16).

The search radius can be set responsive to noise and/or channel conditions. Where a soft output is required all the symbols found may be used for the soft output evaluation, as described below, to avoid the additional complexity of a sorting algorithm.

In summary, the procedure comprises three main processes:

i) Transformation of the multiple-input-multiple-output (IMO) channel into a lattice representation.

ii) The search procedure, which searches for the nearest lattice point to the received signal in the case of hard detection or the set of lattice points around the received signal in the case of soft detection. Where a soft input is available, providing an a priori probability of a transmitted symbol or codeword, this can be utilised to assist the search (see also, for example, H. Vikalo and B. Hassibi, "Low-Complexity Iterative Detection and Decoding of Multi-Antenna Systems Employing Channel and Space-Time Codes," Conference Record of the Thirty-Sixth Asilomar Conference on Signals, Systems and Computers, vol. 1, Nov. 3-6, 2002, pp. 294-298; and H. Vikalo and B. Hassibi, "Towards Closing the Capacity Gap on Multiple Antenna Channels", ICASSP'02, vol. 3, pp. III-2385-III-2388).

iii) Where a soft output is needed, providing the soft output based on the soft input and the set of lattice points found in the search region (this is unnecessary for a hard detection sphere decoder).

As previously mentioned known sphere decoders suffer from variable computational complexity as, depending on the statistics of the channel and the type of space-time code used, the computational complexity is not bounded or deterministic. Here, however, we bound the computational complexity of the sphere decoder by setting or limiting the maximum number of searches performed since the number of the distance metrics $d_n$ calculation required for the search, determines the actual computational complexity.

Figure 2B:
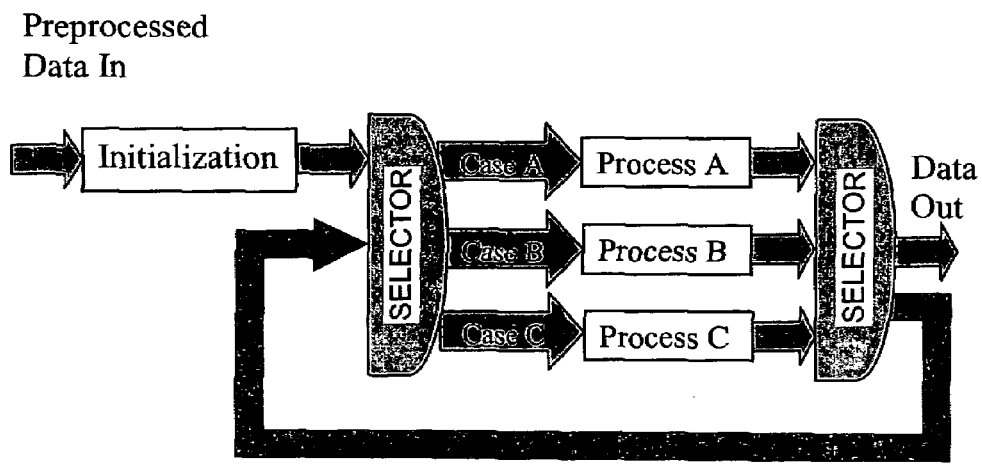
FIGS. 2a to 2c show, respectively, a flow diagram of a sphere decoding procedure embodying an aspect of the present invention, an overview of the procedure of FIG. 2a, and a sphere decoding post-processing procedure according to an embodiment of an aspect of the present invention.
Figure 2A:
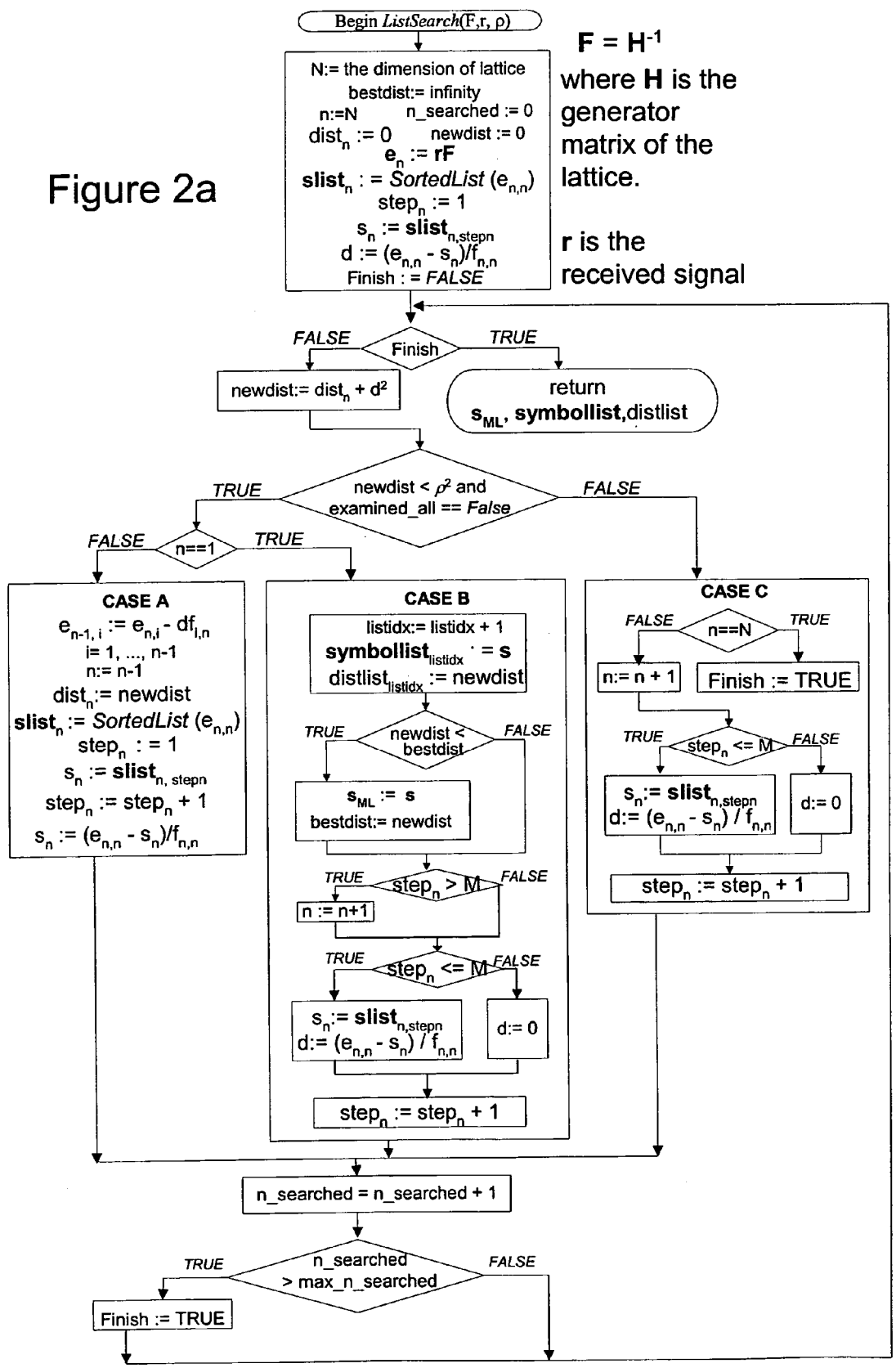

A flow diagram for a sphere decoder to implement such a procedure is shown in FIG. 2a. In FIG. 2a, which is based upon a conventional sphere decoding procedure with modifications, the generator matrix of the lattice H (F=H$^{31\ 1}$ where F is a triangular matrix) is the lattice representation of the communication system and the received signal is r (pre-processed in the same way as the generator matrix for the search procedure). The outputs of the procedure are $s_{ML}$, symbollist and distlist. The output $s_{ML}$ is the lattice input (transmitted signal) corresponding to the lattice point closest to the received signal r and is the maximum likelihood solution. The output symbollist is the list of lattice inputs corresponding to the lattice points found in the search region. The output distlist is the list of distance metrics corresponding to the lattice inputs in symbollist.

The search region is defined by the search radius $\rho^2$. The function SortedList($e_{n,n}$) provides an ordered list of possible symbols to be searched according to an increasing distance from the signal $e_{n,n}$. Thus slist$_n$ is a vector of length M (as slist is a N×M matrix) and step$_n$ counts from 1 to M. The notation slist$_{n,i}$ refers to the ith element of the vector slist$_n$. The zero-forcing solution at the nth dimensional search is given by $e_n$:=rF. The number of unknowns (length of the string of symbols to be estimated) is N (bearing in mind that where I and Q components are to be estimated there are two unknowns per symbol so that the number of unknowns doubles) and the number of possible symbols (in the constellation) searched through is M.

The three Cases A, B and C are as described above; broadly speaking the procedure initialises n=N and examines symbols in slist order until all have been examined (examined_all is true when all symbols in slist$_n$ have been examined at the nth dimensional search), moving up a layer (Case C) when outside the search radius $\rho^2$ and finishing when back at the top of the tree (n= =N). The total number of cases (A, B or C) examined, that is the number of the number of the distance metrics $d_n$ determined is counted by variable n_searched (initialised to zero at the start) and the procedure is stopped when this exceeds limiting value max_n_searched.

This is summarised in FIG. 2b, which divides the search procedure into three different processing blocks according to different states or cases of the search (see Table 1), multiplexing the data into process A, B or C according to whether Case A, B or C is identified by a data multiplexer. A count is kept of each pass around the loop (or of each multiplexing operation) and the procedure is stopped when a limit is reached. The limit may be predetermined or selected according to an application or data rate. Each processing block (A, B, C) evaluates the a distance metric of a lattice point or layer, evaluates the state of the search and selects the next lattice point (or layer) to be searched. The data flow and the processing block are selected according to the condition or case which defines the state of the search. Thus the maximum number of 'iterations' of the search may be set according to a maximum (for example predetermined) number of flops (floating point operations per second), speed or data throughput (data bits per second) required or available for implementation of the detector. By limiting the number of searches the computational complexity of the sphere decoder can thus be bounded.

Broadly speaking, therefore in embodiments of the invention a sphere decoder has a bounded or maximum complexity limited by defining a maximum number of searches performed by the sphere decoding procedure. This enables a robustness of the procedure to be defined in accordance with a predetermined computational complexity (or flops), data throughput or speed, which is available for or expected from an application.

Further features of preferred sphere decoder configurations are described below. One or more of these may be implemented in conjunction with the above described search limiting procedure or separately in an otherwise conventional decoder.

If no candidate is found, i.e. no n-dimensional lattice point, data symbol or code is found in the search region for a predetermined maximum number of points to be examined or searched (or for a pre-determined size of the search region), the zero-forcing solution (or another linear solution such as an MMSE solution) may be provided as the estimated n-dimensional transmitted string symbols or codeword. The zero-forcing solution may be that derived from the first search or a zero-forcing solution one of those re-estimated at each search hierarchy where the effect of the previously found symbol is cancelled out. In this latter case the 'cancellation' may be ordered such that the cancellation is performed from the 'strongest' to the 'weakest' signal. This ordered zero-forcing solution may be obtained by pre-processing the lattice generator matrix using sorted QR decomposition (see, for example, D. Wubben, R. Bohnke, J. Rinas, V. Kuhn and K. D. Kammeyer, "Efficient algorithm for decoding layered space-time codes," IEEE Electronics Letters, vol. 37, pp. 1348-1350, hereby incorporated by reference). The choice of zero-forcing solution may be made dependent upon the overall application.

Soft information may be derived from the zero-forcing solution s'' (or another linear solution) as shown in Equation 23 or 24 below.

$$L_p(x_j^n | s'''^n) = \ln \frac{P(x_j^n = +1 | s'''^n)}{P(x_j^n = -1 | s'''^n)} \quad \text{Equation 23}$$

$$= L_A(x_j^n) + \ln \frac{\sum_{x^n \in Y_{n,j}^{+1}} \exp\left(-\frac{1}{2\sigma^{n2}}\|s'''^n - s^n\|^2 + \frac{1}{2}x_{[n,j]}^T L_{A,[n,j]}\right)}{\underbrace{\sum_{x^n \in Y_{n,j}^{-1}} \exp\left(-\frac{1}{2\sigma^{n2}}\|s'''^n - s^n\|^2 + \frac{1}{2}x_{[n,j]}^T L_{A,[n,j]}\right)}_{L_E(x_j^n | s'''^n)}}$$

$$n = 1, \ldots, n_T \quad j = 1, \ldots, q$$

or, using the Max-Log-MAP approximation:

$$L_E(x_j^n | s'''^n) \approx \frac{1}{2} \max_{x^n \in Y_{n,j}^{+1}} \left\{ -\frac{1}{\sigma^{n2}}\|s'''^n - s^n\|^2 + x_{[n,j]}^T L_{A,[n,j]} \right\} - \frac{1}{2} \max_{x^n \in Y_{n,j}^{-1}} \left\{ -\frac{1}{\sigma^{n2}}\|s'''^n - s^n\|^2 + x_{[n,j]}^T L_{A,[n,j]} \right\} \quad \text{Equation 24}$$

where $s'''^n$ is the nth element of the zero-forcing vector given in Equation 19 and s is the symbol mapping from the q length bit vector $x^n$, i.e. $s^n = \text{map}(x^n)$. The sets $$Y_{n,j}^{+1} \text{ and } Y_{n,j}^{-1}$$

and are the sets of $2^{(q-1)}$ vectors of bits $x^n$ having $x_j^n = +1$ and $x_j^n = -1$, respectively. For hard detection, the zero-forcing vector s'' may be provided as the output.

The noise variance $\sigma^{n2}$ for the nth element is the filtered noise variance at the output of the linear detector. For the case of a zero-forcing linear detector, the filtered noise variance is given by $\sigma^{n2} = \|\tilde{h}_n\|^2 \sigma^2$ where $\tilde{h}_n$ is the nth row vector of zero-forcing filter coefficient $(H^{554} H)^{-1}H^\dagger$ (see "A Simple Soft-Detector for the BLAST System", Jianhua Liu and Jian Li, Workshop Proceedings of Sensor Array and Multichannel Signal Processing, 4-6 Aug. 2002, pp. 159-163, hereby incorporated by reference).

Where at least one candidate string of symbols is found then a soft output comprising bit likelihood values (for example log likelihood ratio, LLR, values) may be determined using Equation 27 below. It will be appreciated that the most likely bit values will not necessarily correspond to the symbols in the most likely symbol string since the bit values are determined by, in effect, averaging over a pluralities of candidate symbol strings (where found) in which a given bit has a values of +1 and −1. It will be appreciated that there are difficulties in this approach when there are no candidate strings found in which the given bit has a value of +1 (or −1), corresponding to a numerator (or denominator) or zero in Equation 27. This difficulty can be addressed as described below.

For the case where either list $L^{+1}$ or $L^{-1}$ corresponding to the candidate containing the bit $x_j^n=+1$ and $x_j^n=-1$, respectively, are found to be empty, a default LLR value is given according to the number of symbols found in the other non-empty list and/or its distance metrics. For example, if $L^{-1}$ is empty, the minimum distance metrics found in list $L^{+1}$ is $$d_{\min}^2,$$

the extrinsic LLR is approximated as follows:

$$L_E(x_j^n) \approx \frac{\frac{1}{2}\left\{-\frac{1}{\sigma^2} \cdot d_{\min}^2 + x_{[n,j]}^T \cdot L_{A,[n,j]}\right\}}{-\frac{1}{2}\left\{-\frac{1}{\sigma^2} \cdot \rho^2 + x_{[n,j]}^T \cdot L_{A,[n,j]}\right\}} \quad \text{Equation 25}$$

max-log approximation

Alternatively, if the non-empty list has a significantly large number of candidates (say larger than a threshold number), and assuming that the candidate(s) which have not been found has a large distance metric (since the maximum permitted number of distance metrics of the search has been calculated), a default maximum LLR value $L_{MAX}$ may be provided. For example, $$L_E(x_j^n) \approx \begin{cases} L_{MAX} & \text{if } L^{+1} \text{ is non-empty, } L^{-1} \text{ is empty} \\ -L_{MAX} & \text{if } L^{+1} \text{ is empty, } L^{-1} \text{ is non-empty} \end{cases} \quad \text{Equation 26}$$

In the case of hard detection, the default LLR value may be determined by Equation 26 with $L_{MAX}=1$. The choice of how the default LLR value is evaluated will depend on the overall system design.

We next describe search strategies. For a specific spherical search region defined by the sphere radius at the received signal or output space, as shown in Equation 8, there is a corresponding search constraint at the transmitted signal or input space. In embodiments of the invention, explicit calculation of the lower-bound and upper-bound of the search constraint is avoided by ordering the layers searched such that the first searched layer at the n-th dimensional search is the n-th element of the zero-forcing solution in the input space. Subsequent searching is preferably such that the ordering of the layers to be searched is in increasing distance from the zero-forcing solution in the input space. When the searched n-th dimensional layer has a larger accumulated distance metric than the sphere radius, with respect to the received signal, the searched n-th layer is considered the input bound of the current search hierarchy and a lattice search is performed on the next search hierarchy.

Turning now to bit probability values, the distance metrics from the search procedure of the sphere decoder may be passed on and utilised by a soft-information-calculation block which provides a soft output from the decoder. Recalling again Equation 6, the soft output in terms of the a posteriori LLR of the decoded or detected bit $x_j^n$ conditioned on the received channel vector r can be estimated as follows:

$$L_P(x_j^n \mid r) = L_A(x_j^n) + \ln \frac{\sum_{x \in L^{+1}} \exp\left(\frac{1}{2\sigma^2}\|r - sH\|^2 + \frac{1}{2}x_{[n,j]}^T L_{A,[n,j]}\right)}{\sum_{x \in L^{-1}} \exp\left(\frac{1}{2\sigma^2}\|r - sH\|^2 + \frac{1}{2}x_{[n,j]}^T L_{A,[n,j]}\right)}$$

$$L_A(x_j^n) + \ln \frac{\sum_{x \in L^{+1}} \exp\left(\frac{1}{2\sigma^2}d_x^2 + \frac{1}{2}x_{[n,j]}^T L_{A,[n,j]}\right)}{\sum_{x \in L^{-1}} \exp\left(\frac{1}{2\sigma^2}d_x^2 + \frac{1}{2}x_{[n,j]}^T L_{A,[n,j]}\right)}$$

$$\underbrace{\phantom{XXXXXXXXXXXXXXXXXXXXX}}_{L_E(x_j^n)}$$

or alternatiely, usingmax-log-MAP approximation, $$L_E(x_j^n) \approx \frac{1}{2}\max_{x \in L^{+1}}\left\{-\frac{1}{\sigma^2} \cdot d_x^2 + x_{[n,j]}^T \cdot L_{A,[n,j]}\right\} - \quad \text{Equation 27}$$

$$\frac{1}{2}\max_{x \in L^{-1}}\left\{-\frac{1}{\sigma^2} \cdot d_x^2 + x_{[n,j]}^T \cdot L_{A,[n,j]}\right\}$$

max-log approximation where s is the space-time symbol mapping of the bit vector x, H is the MIMO channel matrix, the term $\sigma^2$ is the noise variance per real component, $L^{+1}$ is the set of bit vectors x corresponding to the list of symbols found in the search procedure with the element containing the bits $x_j^n=+1$, $x_{[n,j]}$ denotes the subvector of x obtained by omitting the bit $x_j^n$ and $L_{A,[n,j]}$ denotes the vector of all the a priori LLRs $L_A$, also omitting the element which represents the LLR of $x_j^n$.

The noise variance may be obtained in any convenient manner, depending upon the overall system design. For example, the noise variance may be obtained during the training period where channel impulse response is estimated. During the training period, the transmitted symbol sequence is known. Together with the estimated channel impulse response, the 'noiseless' received signal is obtained. The noise variance may be estimated from evaluating the noise statistic of the sequence of received signal during the 'training period', knowing the sequence of 'noiseless' received signal.

The term $d_x^2$ is the distance metrics obtained from the search algorithm correspond to the symbols obtained from the space-time symbol mapping of the bit vector x. The a priori LLRs $L_A$ may be obtained from a soft input to the sphere decoder. The term $L_E$ is the extrinsic LLRs. The a priori LLRs $L_A$ can be obtained from an external component such as a channel decoder or another space-time decoder. The a priori LLRs $L_A$ can also be the extrinsic LLR $L_E$ from the decoding of the previous iteration if an iterative decoding structure is employed. The soft output provides either the a posteriori or the extrinsic LLRs, depending on the application.

The calculation of logarithmic of summation in Equation 27 can be approximated by a conventional Jacobian logarithmic relationship (also known as a 'sum-log' approximation (see, for example, P. Robertson, E. Villebrun and P. Hoher, "A comparison of optimal and sub-optimal MAP decoding algorithm operating in the log domain," in IEEE Intern. Conf. on Commun., 1995, pp. 1009-1013) or 'max-log' approximation. As discussed previously, for the case where one or both the lists $L^{+1}$ and $L^{-1}$ are found to be empty or no symbols are found corresponding to $x_j^n=+1$ or/and $x_j^n=+1$, a default LLR value may be given according to the number of symbols found in the other non-empty list. If both lists are empty conventional LLR values based on the soft zero-forcing solution may be provided.

Figure 2C:
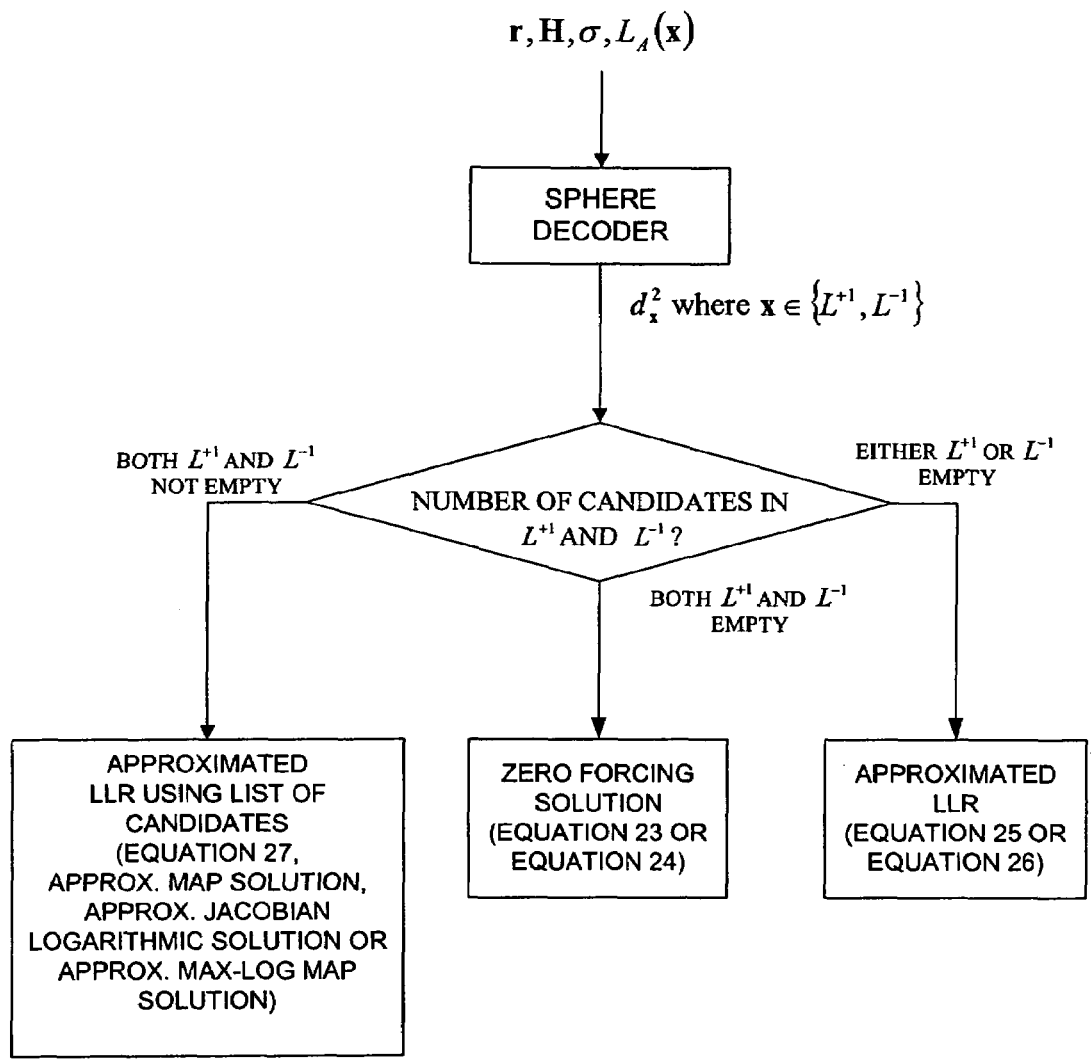

The selection of an output from the decoder based upon Equation 27, Equation 23/24 or Equation 25/26 in response to the occupancy of lists $L^{+1}$ and $L^{-1}$ (ie the number candidate solutions (lattice points) found having values of a given bit of +/−1) is summarised in the flow diagram of FIG. 2c.

As shown in FIG. 2c, if the sphere decoding algorithm is stopped before it is known it has reached the closest lattice point to the received signal (we know when this has been reached for example because the (partial) tree described above has been completed) then the closest point found so far may or may not be the actual closest. This is the left hand branch of the decision box of FIG. 2c. In this case there is an alternative to that shown in FIG. 2c, which is to use a less complex linear detector to determine a solution, for example a zero forcing (ZF) solution, or even to use a default value.

As previously described, the sphere radius defining the area of the search region determines the reliability of the soft output obtained from the found candidates or lattice points which are near the received signal. The sphere radius can be set to a fixed value in order to obtain a list of candidates of lattice points which contribute significantly to the APP detection shown in Equation 6, or the sphere radius can be adjusted, for example responsive to reception conditions. However, for a hard decision output, the sphere radius may be reduced to the Euclidean distance of the found lattice point to the received signal such that only one lattice point is found at the end of the search.

Figure 3:
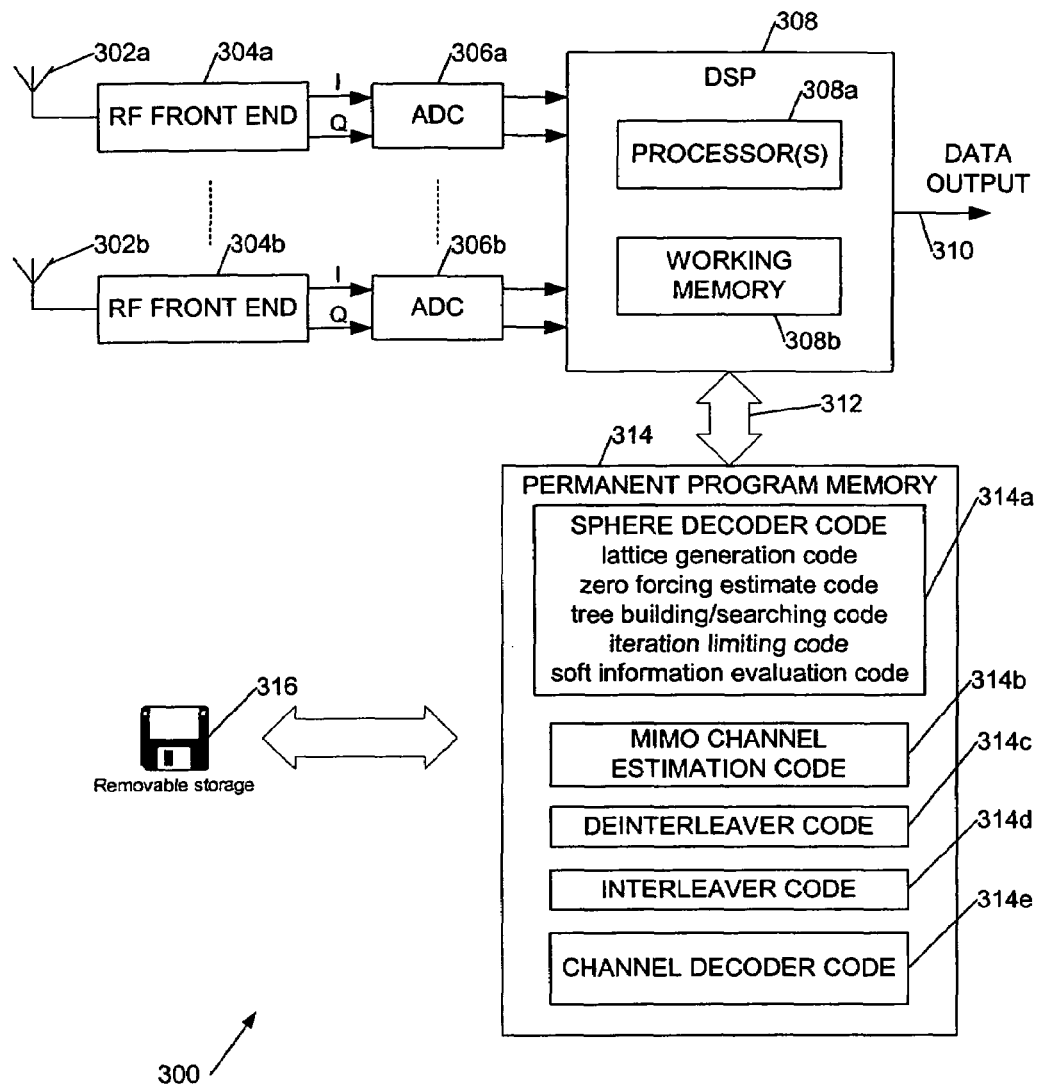
FIG. 3 shows a receiver incorporating a sphere decoder configured to operate in accordance with an embodiment of the present invention.

FIG. 3 shows a receiver 300 incorporating a decoder configured to implement an embodiment of the above described method.

Receiver 300 comprises one or more receive antennas 302a, b (of which two are shown in the illustrated embodiment) each coupled to a respective rf front end 304a, b, and thence to a respective analogue-to-digital converter 306a,b and to a digital signal processor (DSP) 308. DSP 308 will typically include one or more processors 308a and working memory 308b. The DSP 308 has a data output 310 and an address, data and control bus 312 to couple the DSP to permanent program memory 314 such as flash RAM or ROM. Permanent program memory 314 stores code and optionally data structures or data structure definitions for DSP 308.

As illustrated program memory 314 includes sphere decoder code 314a comprising lattice generation code (from the matrix channel estimate), zero forcing estimate code, tree building/searching code, iteration limiting code and, for a soft output decoder, soft information evaluation code to, when running on DSP 308, implement corresponding functions as described above. Program memory 314 also includes MIMO channel estimation code 314b to provide a MIMO channel estimate H, and, optionally, de-interleaver code 314c, interleaver code 314d, and channel decoder code 314e. Implementations of de-interleaver code, interleaver code, and channel decoder code are well known to those skilled in the art. Optionally the code in permanent program memory 314 may be provided on a carrier such as an optical or electrical signal carrier or, as illustrated in FIG. 3, a floppy disk 316.

The data output 310 from DSP 308 is provided to further data processing elements of receiver 300 (not shown in FIG. 3) as desired. These may a baseband data processor for implementing higher level protocols.

The receiver front-end will generally be implemented in hardware whilst the receiver processing will usually be implemented at least partially in software, although one or more ASICs and/or FPGAs may also be employed. The skilled person will recognise that all the functions of the receiver could be performed in hardware and that the exact point at which the signal is digitised in a software radio will generally depend upon a cost/complexity/power consumption trade-off.

In other embodiments the decoder may be provided as a signal processing module, for example implementing a soft-in/soft-out space-time decoder.

In summary, embodiments of the invention implement a bounded computational complexity solution by defining the maximum number of iteration in the data flow as shown in FIGS. 2a and 2b, that is by limiting the number of searches to be performed to locate candidates for possible transmitted symbols. The search algorithm can be decomposed into three sub-processes (or processing blocks) relating to three different cases or states of the search. Each processing block evaluates the distance metrics of the lattice point or layers, evaluates the state of the search and selects the next lattice point or layers to be searched. The data flow and the processing block are selected according to the condition or case which defines the state of the search (see Table 1). When no lattice point (insufficient candidates) is (are) found by the search procedure upon achieving the maximum number of iteration/search, or when there is no lattice point within the search bound, a linear solution such as the zero-forcing solution may be provided as a default detected symbol or codeword. For soft detection, is a soft output is derived from the soft zero-forcing solution. For cases where either one of the lists $L^{+1}$ and $L^{-1}$ are found to be empty a default LLR value is provided, for example according to the number of symbols found in the other non-empty list and/or its distance metrics. Where both these lists are populated one or more stored distance metrics of the lattice point(s) found in the search region are passed on to a process which evaluates a soft bit probability output.

Figure 4:
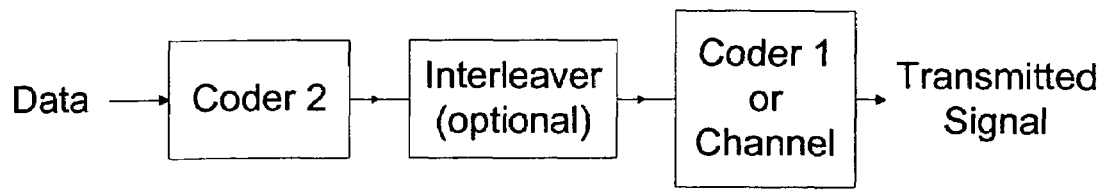
FIG. 4 shows a block diagram of a transmitter with concatenated encoders.

FIG. 4 shows a block diagram of a transmitter with concatenated channel encoders; the frequency selective channel can be considered to be an 'encoder'. In FIG. 4 Coder 2 may comprise a conventional channel encoder and Coder 1 an STBC coder in combination with the channel.

Figure 5:
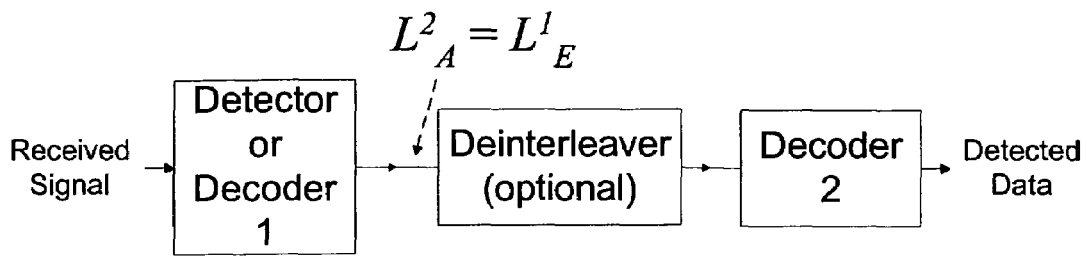
FIG. 5 shows a block diagram of a receiver with concatenated decoders for use with the transmitter of FIG. 4.
Figure 6:
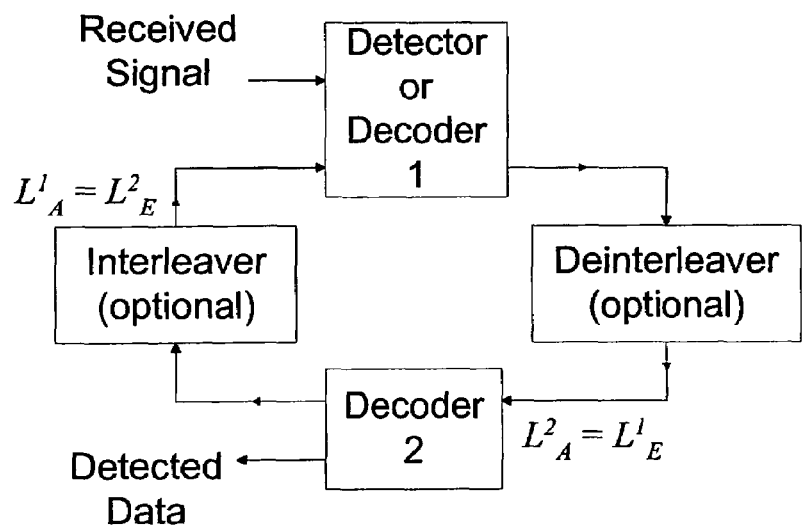
FIG. 6 shows a block diagram of a receiver with concatenated decoders and iterative decoding for use with the transmitter of FIG. 4.
Figure 7:
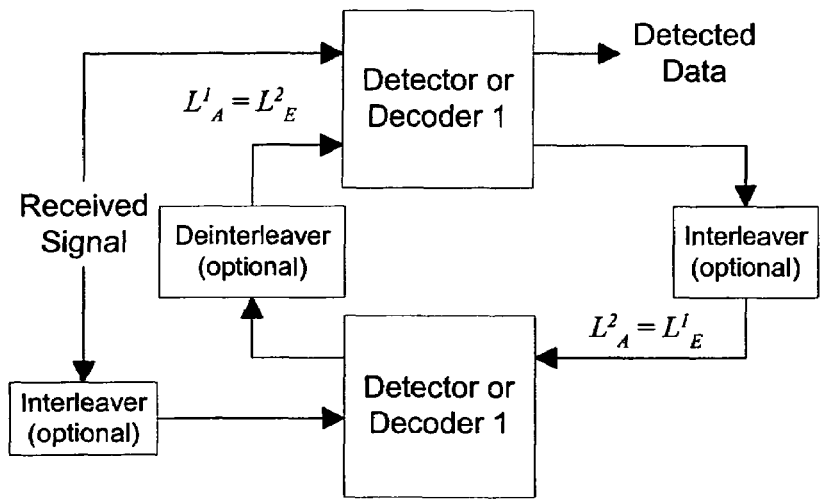
FIG. 7 shows a block diagram of a receiver employing iterative feedback between two equivalent decoders.

FIG. 5 shows a block diagram of a receiver with concatenated channel decoders or detectors, suitable for use with the transmitter of FIG. 4. In FIG. 5 detector or Decoder 1 may comprise a space-time sphere decoder as described above, and Decoder 2 a conventional channel decoder. FIG. 6 shows a block diagram of a variant of the receiver of FIG. 5, with concatenated decoders or detectors employing iterative or "turbo" decoding. FIG. 7 shows a block diagram of a receiver comprising two instances of Decoder 1, which may comprise, for example, a space-time decoder. In FIG. 7 the output of one decoder provides a priori knowledge for the other decoder. In this way the decoder component iteratively exchanges soft information in effect with itself to improve the reliability of the detected data. The received signal is provided to both decoders, optionally (depending upon the interleaving arrangement at the transmitter) interleaved in one case.

Figure 8:
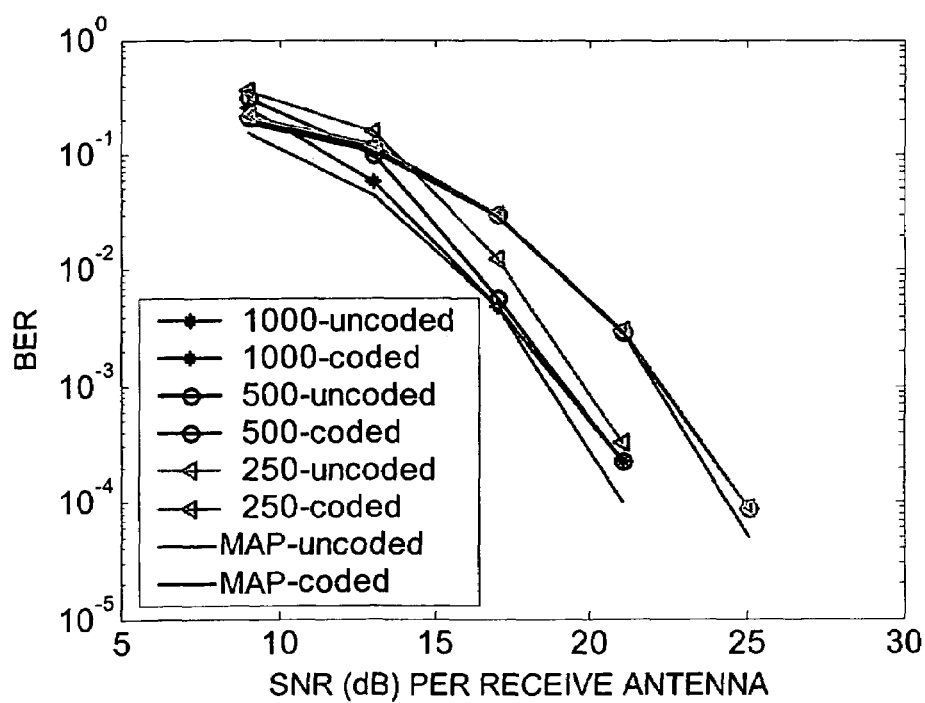
FIG. 8 shows bit error rate against received signal to noise ratio, comparing embodiments of a decoder according to the present invention with maximum a posteriori probability (MAP) decoding for signals with and without a channel code.

FIG. 8 shows coded and uncoded BER (bit error rates) against signal to noise ratio (in dB) per receive antenna for a 4-by-4 16QAM (quadrature amplitude modulation) MIMO system, comparing a sphere decoder (curves 802 to 807) as described above with various numbers of computational iterations with a maximum likelihood (ML) detector (curves 800, 801) under uncorrelated frequency flat Rayleigh-faded channel conditions for uncoded (curves 800, 802, 804, 806) and coded (curves 801, 803, 805, 807) transmitted signals. The results were obtained with the simulation of 500 data blocks and the sphere decoder was limited after 250 (curves 802, 803), 500 (curves 804, 805) and 1000 (curves 806, 807) distance metric calculations. The squared sphere radius was equal to:

5×(noise variance)×(number of receive antenna)/(average signal power per transmit antenna)

The ML detector required $8 \times 16^4 = 524288$ distance metrics measurement per received symbol and thus the 250, 500, and 1000 computational pass sphere decoders provide a factor of approximately 2000, 1000 and 500 minimum computational complexity reduction respectively.

The above described techniques can also be applied to what we have termed a max-log MAP sphere decoder—as described in the Applicant's co-pending UK patent application no. 0323211.3 filed 3 Oct. 2003 (and also in corresponding applications claiming priority from this UK application), the contents of which are hereby incorporated by reference in their entirety—and, in particular, to provide a bound for sphere decoder evaluation of Equation 11 of that document.

Embodiments of the invention have applications in many types of communication system, including MIMO and multiuser systems, for example for wireless computer or phone networking. In multiuser systems, for example, the generator matrix or erquivalent channel matrix may represent a combination of spreading and channel effects for the users (see, for example, L. Brunel, "Optimum Multiuser Detection for MC-CDMA Systems Using Sphere Decoding", 12th IEEE International Symposium on Personal, Indoor and Mobile Radio Communications, Volume 1, 30 Sep.-3 Oct. 2001, pages A-16-A-20 vol. 1, hereby incorporated by reference).

In other applications the decoder can be applied as a block equaliser for frequency selective fading. Here, the channel model of equation 9 may be modified to take into account the channel memory as shown below:

$$\check{r} = \check{s}\check{H} + \check{v}$$

where $$\check{H} = \begin{bmatrix} H_1 & H_2 & \cdots & H_L & & & \\ & H_1 & \cdots & \vdots & \ddots & & \\ & & \ddots & & & H_L & \\ & & & H_1 & \vdots & \ddots & \\ & & & & \ddots & \cdots & H_L \\ & & & & H_1 & \cdots & H_{L-1} & H_L \end{bmatrix}$$

$$\check{r} = [r_1 \quad r_2 \quad \cdots \quad r_{T+L-1}],$$

$$\check{s} = [s_1 \quad s_2 \quad \cdots \quad s_T],$$

$$\check{v} = [v_1 \quad v_2 \quad \cdots \quad v_{T+L-1}],$$

and where T is the length of the symbol block being equalized and $H_i$, $i=1, \ldots, L$, is the ith MIMO channel tap, and where L is an estimate of the maximum length of the channel impulse response (in symbol periods). The sphere decoder can then be employed to detect the transmitted block š.

Embodiments of the invention can be applied as a channel decoder where the channel encoder can be represented by a linear generator matrix G. Examples are block channel codes (see "Digital Communications: Fundamentals and Applications", Bernard Sklar, Prentice Hall International Editions, 1999, 0-13-212713-X) such as Hamming code and Linear Density Parity Check (LDPC) coding where the codeword x is generated by the generator matrix G from the information bits s through x=sG, where the vector s contains the information bits. For LDPC code, for example, the generator matrix G is derived from the parity check matrix H to fulfil the orthogonality requirement $GH^T=0$ and any legitimate codeword will satisfy the condition $xH^T=0$. Here, the information and codeword blocks, s and x, respectively, are comprised of binary digits, i.e. 1 and 0, and the matrix operations are in a binary field.

Embodiments of the invention provide the maximum likelihood codeword or the soft output based on Equation 7. In an example implementation, the sphere decoder with input r and using G as the generator matrix, determines the distance between the received signal r and each of the possible transmitted codewords in its search. The codeword with the minimum distance is the maximum likelihood codeword. This employs a translation of the information and codeword blocks from a binary field, $\{0,1\}$ to signed values $\{-1, +1\}$ and arithmetic operations are then used.

In general, embodiments of the above sphere decoding techniques can be applied in any systems representable by a (preferably linear) generator matrix.

The skilled person will appreciate that the above described techniques may be employed for example in base stations, access points, and/or mobile terminals. Broadly speaking embodiments of the invention facilitate cheaper receivers without a loss of performance, or equivalently increased data rates without correspondingly increased complexity and cost. Embodiments of the invention may also potentially find application in non-radio systems, for example a disk drive with multiple read heads and multiple data recording layers in effect acting as multiple transmitters.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of decoding a transmitted string of symbols received over a channel as a received signal, each of said transmitted symbols having one of a plurality of values, the method comprising:
    searching for a candidate string of symbols, said candidate string of symbols including a string of candidate symbols, by searching for said candidate symbols within a region of a multi-dimensional lattice determined by a channel response of said channel, said multi-dimensional lattice having one dimension associated with each of said symbols of said transmitted string of symbols, said region defined by a distance from said received signal; and
    decoding said transmitted string of symbols by selecting said candidate string of symbols,
    wherein said searching for said candidate string of symbols includes selecting a candidate value for one of said transmitted symbols, and testing whether a part of said multi-dimensional lattice defined by said selected candidate value is within a bounding distance from said received signal;
    said searching for said candidate symbols is stopped after a limiting number of performances of said testing; and
    said decoding includes providing a linear estimate of said transmitted string of symbols when said searching for said candidate string of symbols fails to locate said candidate string of symbols.

2. The method as claimed in claim 1, wherein said testing comprises determining which of three categories one of said candidate symbols belongs to, a first category in which said part of said multi-dimensional lattice defined by said one of said candidate symbols is inside said bounding distance, a second category in which said part of said multi-dimensional lattice defined by said one of said candidate symbols is outside said bounding distance, and a third category in which said one of said candidate symbols includes a last symbol of said candidate string.

3. The method as claimed in claim 1, wherein said linear estimate comprises a zero-forcing estimate.

4. The method as claimed in claim 1, wherein one of said symbols of said transmitted string comprises a bit,
said decoding includes providing a soft output including a likelihood value for said bit of said one of said symbols of said transmitted string, and
the method includes deriving said likelihood value from said linear estimate.

5. The method as claimed in claim 1, wherein said decoding includes providing a soft output determined responsive to a distance metric for said selected candidate string of symbols, said distance metric being dependent upon a distance of said candidate string of symbols from said received signal.

6. The method as claimed in claim 5, wherein said soft output is determined responsive to each distance metric for each candidate string of symbols found by said searching for said candidate string of symbols.

7. The method as claimed in claim 1, wherein one of said symbols of said transmitted string comprises a bit, whereby said transmitted string of symbols defines a string of bits, and
said decoding includes providing a probability value for each bit of said string of bits.

8. The method as claimed in claim 7 wherein the decoding further comprises determining a provided probability value for a bit using a first set of symbols of said candidate string of symbols in which the bit has a first logic value and a second set of symbols of said candidate string of symbols in which the bit has a second logic value different to said first logic value, by taking a ratio of first and second likelihood values determined using said first and second sets of symbols,
the method comprising providing a default probability value for said bit when one of said first and second sets of symbols is empty.

9. The method as claimed in claim 1, wherein said searching for candidate string of symbols proceeds in order of increasing distance from an initial estimate.

10. The method as claimed in claim 1, wherein said transmitted string of symbols is transmitted over a MIMO (multiple-input multiple-output) channel using a plurality of transmit antennas, and
said received signal is received by a plurality of receive antennas.

11. The method as claimed in claim 1, wherein said transmitted string of symbols is encoded using a space-time block code.

12. A computer-readable medium including computer executable instructions, wherein the instructions, when executed by a processors, cause the processor to perform the method of claim 1.

13. A decoder for decoding a transmitted string of symbols received over a channel as a received signal, each of said transmitted symbols having one of a plurality of values, the decoder comprising:
means for searching for a candidate string of symbols, said candidate string of symbols including a string of candidate symbols, by searching for said candidate symbols within a region of a multi-dimensional lattice determined by a channel response of said channel, said multi-dimensional lattice having one dimension associated with each of said symbols of said transmitted string of symbols, said region defined by a distance from said received signal; and
means for decoding said transmitted string of symbols by selecting said candidate string of symbols,
wherein said means for searching for said candidate string of symbols selects a candidate value for one of said transmitted symbols, and tests whether a part of said multi-dimensional lattice defined by said selected candidate value is within a bounding distance from said received signal; and
said searching for said candidate symbols is stopped after a limiting number of tests; and
said means for decoding provides a linear estimate of said transmitted string of symbols when said means for searching fails to locate said candidate string of symbols.

14. A receiver including the decoder of claim 13.

15. A decoder for decoding a received signal including a string of symbols transmitted over a channel, the decoder comprising:
a sphere decoder configured to search for a candidate transmitted symbol string within a radius of said received signal by determining distances from said received signal in a received signal space of candidate symbols for said string of symbols, and to provide a decoded data output; and
a sphere decoder controller configured to count a number of distance determinations and to control said sphere decoder to stop searching responsive to said count,
wherein said sphere decoder is configured to provide a linear estimate of said string of symbols when said sphere decoder fails to locate said candidate transmitted symbol string.

16. The decoder as claimed in claim 15, wherein said channel is a MIMO channel.

* * * * *